(12) United States Patent
Lii et al.

(10) Patent No.: US 9,768,105 B2
(45) Date of Patent: Sep. 19, 2017

(54) RIGID INTERCONNECT STRUCTURES IN PACKAGE-ON-PACKAGE ASSEMBLIES

(75) Inventors: Mirng-Ji Lii, Sinpu Township (TW); Chen-Hua Yu, Hsin-Chu (TW); Chien-Hsiun Lee, Chu-tung Town (TW); Yung Ching Chen, Dali (TW); Jiun Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 586 days.

(21) Appl. No.: 13/452,589

(22) Filed: Apr. 20, 2012

(65) Prior Publication Data

US 2013/0277841 A1    Oct. 24, 2013

(51) Int. Cl.
*H01L 25/07* (2006.01)
*H01L 21/60* (2006.01)
(Continued)

(52) U.S. Cl.
CPC .... *H01L 23/49838* (2013.01); *H01L 23/5283* (2013.01); *H01L 23/5386* (2013.01); *H01L 24/13* (2013.01); *H01L 24/16* (2013.01); *H01L 24/20* (2013.01); *H01L 24/24* (2013.01); *H01L 25/105* (2013.01); *H01L 23/49811* (2013.01); *H01L 2224/16238* (2013.01); *H01L 2224/48091* (2013.01); *H01L 2224/48227* (2013.01);
(Continued)

(58) Field of Classification Search
CPC ........... H01L 2924/15312; H01L 24/10; H01L 2225/1058

USPC ................................................ 257/E23.589
See application file for complete search history.

(56) References Cited

U.S. PATENT DOCUMENTS 6,431,432 B1 * 8/2002 McCormick ........ H01L 21/4853
228/215
6,727,579 B1 * 4/2004 Eldridge .................. H05K 3/24
257/692

(Continued)

OTHER PUBLICATIONS

Xu, H., et al., "Manufacture of Hourglass-Shaped Solder Joint by Induction Heating Reflow," 2008 International Conference on Electronic Packaging Technology & High Density Packaging, 5 pages.

*Primary Examiner* — Mark Tornow
*Assistant Examiner* — Abbigale Boyle
(74) *Attorney, Agent, or Firm* — Slater Matsil, LLP

(57) ABSTRACT

System and method are disclosed for creating a rigid interconnect between two substrate mounted packages to create a package-on-package assembly. A solid interconnect may have a predetermined length configured to provide a predetermined package separation, may be cylindrical, conical or stepped, may be formed by extrusion, casting, drawing or milling and may have an anti-oxidation coating. The interconnect may be attached to mounting pads on the top and bottom packages via an electrically conductive adhesive, including, but not limited to solder and solder paste. A solder preservative or other anti-oxidation coating may be applied to the mounting pad. A package-on-package assembly with solid interconnects may have a top package configured to accept at least one electronic device, with the solid interconnects mounted between the top package and a bottom package to rigidly hold the package about parallel to each other.

20 Claims, 3 Drawing Sheets

(51) Int. Cl.
- *H01L 23/498* (2006.01)
- *H01L 23/538* (2006.01)
- *H01L 23/00* (2006.01)
- *H01L 23/528* (2006.01)
- *H01L 25/10* (2006.01)

(52) U.S. Cl.
CPC ............ *H01L 2225/1023* (2013.01); *H01L 2225/1058* (2013.01); *H01L 2924/10253* (2013.01)

(56) References Cited

U.S. PATENT DOCUMENTS

| | | | |
|---|---|---|---|
| 6,884,707 B1 * | 4/2005 | Cherian | H01L 23/49555 257/696 |
| 7,390,370 B2 * | 6/2008 | Uno | C22C 5/02 148/430 |
| 7,427,558 B2 * | 9/2008 | Kim | H01L 21/4867 257/E21.503 |
| 2008/0217768 A1 * | 9/2008 | Miranda | H01L 24/11 257/737 |
| 2010/0061056 A1 * | 3/2010 | Searls | H01L 21/563 361/679.56 |

* cited by examiner

RIGID INTERCONNECT STRUCTURES IN PACKAGE-ON-PACKAGE ASSEMBLIES

BACKGROUND

Generally, one of the driving factors in the design of modern electronics is the amount of computing power and storage that can be shoehorned into a given space. The well-known Moore's law states that the number of transistors on a given device will roughly double every eighteen months. In order to compress more processing power into ever smaller packages, transistor sizes have been reduced to the point where the ability to further shrink transistor sizes has been limited by the physical properties of the materials and processes. Designers have attempted to overcome the limits of transistor size by packaging ever larger subsystems into one chip (systems on chip), or by reducing the distance between ships, and subsequent interconnect distance.

One method used to reduce the distance between various chips forming a system is to stack chips, with electrical interconnects running vertically. This can involve multiple substrate layers, with chips on the upper and lower surfaces of a substrate. One method for applying chips to the upper and lower side of a substrate is called "flip-chip" packaging, where a substrate has conductive vias disposed through the substrate to provide an electrical connection between the upper and lower surfaces. These interposer substrates for flip chips are commonly silicon, glass or some other insulator with copper, gold or other conductors disposed in the vias through the interposer.

The through silicon vias (TSVs) are also used to create 3D integrated circuits, and are advantageous over wire bonding or other connection techniques because it permits a substantially higher density vias in a given amount of space, and because the length of the connections is shorter. A 3D package such as System in Package, Chip Stack Multi-Chip Module (MCM), etc. contains two or more chips (integrated circuits, ICs) stacked vertically so that they occupy less space and/or have greater connectivity. The different dies in the stack may be heterogeneous, e.g. combining CMOS logic, DRAM and III-V materials into a single IC. An alternate type of 3D package is Silicon Carrier Packaging Technology, where ICs are not stacked but a carrier substrate containing TSVs is used to connect multiple ICs together in a package. In most 3D packages, the stacked chips are wired together along their edges and this edge wiring slightly increases the length and width of the package and usually requires an interposer layer between the chips. In some 3D packages, through-silicon vias replace edge wiring by creating vertical connections through the body of the chips. The resulting package has no added length or width. Because no interposer is required, a TSV 3D package can also be flatter than an edge-wired 3D package. This TSV technique is sometimes also referred to as TSS (Through-Silicon Stacking or Thru-Silicon Stacking). A 3D integrated circuit (3D IC) is a single integrated circuit built by stacking silicon wafers and/or dies and interconnecting them vertically so that they behave as a single device. By using TSV technology, 3D ICs can pack a great deal of functionality into a small footprint.

Frequently, packages are joined using wire bonding, where a conductive wire is spot welded or soldered to a pad, and then cut and welded to a second pad. Gold is frequently used for both the bonding pads and wires in such a case, primarily due to gold's resistance to oxidation and relatively low welding temperature. Solder ball grid arrays are also a technique sometimes used to joining packages, with an array of solder balls deposited on the bonding pads of a first package, and with a second package joined at its own bonding pad sites to the first pad via the solder balls. The environment with the solder ball grid array is heated to melt the solder balls and the packages compressed to cause the solder balls to contact the pads on both packages.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1A:
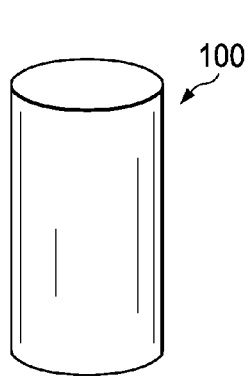
FIGS. 1A-1C are diagrams illustrating various selected embodiments of solid interconnects.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely making and using solid interconnects in package-on-package assemblies. Other embodiments may also be applied, however, to other electrically connected components, including, but not limited to, bare chips without packaging, displays, input components, board mounting, die or component mounting, or connection packaging or mounting of combinations of any type of integrated circuit or electrical component.

The present concepts are directed to providing a solid interconnect apparatus to separate, support and electrically connect one or more electrical components. Solid interconnect may provide a higher density of interconnects than alternative methods of packaging, and reduce the failure rate of interconnected assemblies. Solid interconnects may be used to attach, or stack multiple packages vertically, connecting the stacked packaged via redirection layer (RDL) contacts, electrical traces, mounting pads or the like. The solid interconnect permits use of solder paste or conductive adhesive, which require a far lower temperature than traditional wire bonding, which may cause rapid oxidation of the mounting pads and subsequent failure of the wire-to-pad bond, either through pad cratering or other "non-stick on pad" failure.

The solid interconnects may be mounted between two packages and be used as stand-offs for package-on-package (PoP) assemblies, where the solid nail supports an upper package when stacked on a lower, carrier package. Component packages may be one or more components mounted onto a carrier board, or substrate. Interconnects made through the substrate may be through silicon vias (TSVs), which provide an electrically conductive path through the substrate. Additionally, the substrate may have a redirection layer (RDL) applied on the upper and lower surfaces and electrically connected to a TSV, so that a component mounted on a surface of the substrate may be in electrical communication with a component mounted on the opposite surface of the substrate. Additionally, traces for the RDL need not terminate at a TSV. Instead, the RDL may be disposed along a surface of the substrate to provide mounting pads and electrical connection between two or more components on that substrate surface.

Multiple level RDLs or traces may also be used on a substrate, where a first RDL layer is coated with an insulator, such as silicon dioxide. A second RDL layer may then formed over the insulator to create a two layer RDL system. Interconnection between RDL layers may be accomplished using TSVs as well. This layering of RDLs and insulators can be repeated to construct the desired RDL structure.

While the embodiments of the solid interconnects are described herein as solid, in particularly useful embodiments, the interconnects are solidly constructed, rigid or otherwise capable of securely separating opposing packages.

With reference now to FIG. 1A, a first embodiment of a cylindrical interconnect (nail) 100 is depicted. In this embodiment, the nail may have a generally cylindrical shape. A nail may permit the upper package to be held at a predetermined, and advantageous, distance from the lower package, so that the upper package remains solidly attached to the lower package, yet keeps the upper package from resting on, or contacting any die or component carried on the top surface of the lower package. In particularly useful embodiments, the nail may have a generally or substantially flat surface on each end, and the nails may hold the packages about parallel to each other. Use of a flat surface may aid in placing the nail into position on a mounting pad and mounting a second, upper package on the nail. Alternatively, the nails ends may be concave to accept an adhesive, or may have any other advantageous shape.

Figure 1B:
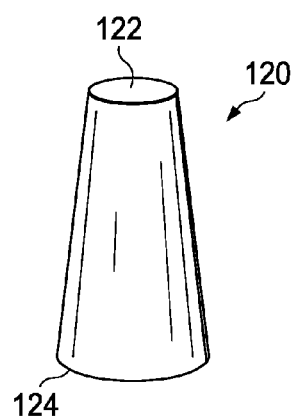
Figure 1C:
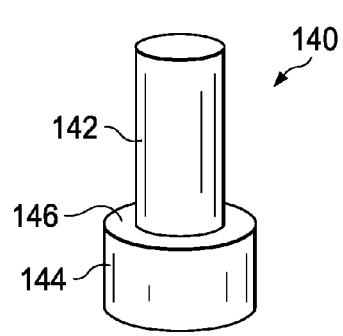

FIG. 1B is a diagram illustrating an alternative embodiment of the presented principles in the form of a conical interconnect nail 120. In this embodiment, the nail may be a truncated cone, with a flat top 122 and bottom surface 124. Alternatively, FIG. 1C illustrates yet another alternative embodiment of the presented principles in the form of a stepped interconnect nail 140. In that embodiment, the nail may have a cylindrical body 142 with a larger diameter cylindrical base 144 separated from the body 142 by a shoulder 146.

A nail with a broader base and narrower top, such as a conical or stepped nail, may be advantageous when placing the nail on a package without adequate adhesive on the pad. For example, where a thin layer of solder paste is laid down on the pads of the lower package, a nail may need additional width to remain stable while the package is handled, prior to application of the upper package or permanent attachment of the nail to the bottom package. The narrower top may permit use of a combination of attachment media, and in particular may provide room for solder or solder paste to flow around the upper portion of the nail without increasing the diameter of the nail past that of the base once the nail is permanently bonded to the upper and lower package.

Interconnect nails may be advantageously used in particularly useful embodiments where the density of connection points is critical. Since interconnect nails are structurally sound, and provide support and separation between mounted packages, the nails may have a higher height-to-diameter aspect ratio than can be achieved than solder ball mounting. Solder balls require enough spacing between individual solder balls so that when the solder is in liquid form, the individual solder balls do not contact each other. When liquid, the surface tension of a solder ball tends to cause the solder ball to have a 1:1 aspect ratio. That is, the solder ball will be about as wide as it is high, reducing the interconnect density achievable with the solder ball mounting technique. Solder balls generally have a minimum diameter of about 25 micrometers, with a bond pitch between about 300 and 400 micrometers. In contrast, an interconnect nail may have a diameter between about 15 and 300 micrometers, preferably between about 20 and 250 micrometers, and a bond pitch between about 35 micrometers and 500 micrometers, with a preferable bond pitch between about 50 and 350 micrometers. Thus, using the longest axis of the interconnect nail to space the packages, in combination with the rigid nature of the nail, provides a greater density of interconnects than solder ball mounting.

Additionally, while interconnect nails may be made from any suitable conductive material, in particularly useful embodiments of the presented principles the nails may be copper. Materials such as, but not limited to, gold, aluminum, palladium, nickel, silver and gold-nickel alloys may also be advantageously employed without deviating from the presented principles. Additionally, a copper nail may be advantageously coated in an anti-oxidation coating, such as palladium, silver, gold or the like.

Figure 2A:
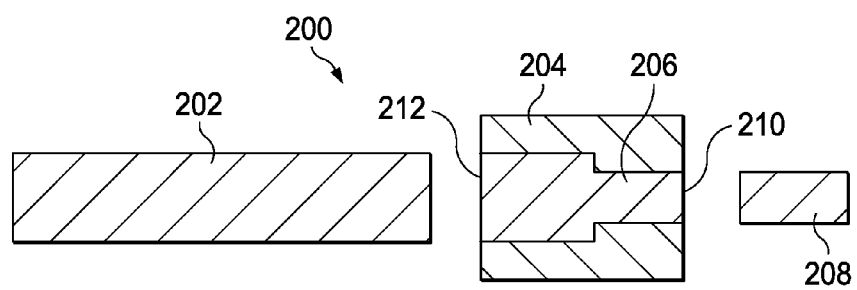
FIGS. 2A and 2B are cross-section diagrams illustrating embodiments for creation of solid interconnects.

FIG. 2A is a cross-sectional diagram illustrating an embodiment 200 for creation of a stepped interconnect nail 206. The various embodiments of the nails may be made via any suitable method, such as, but not limited to milling, casting, drawing, extrusion. Skilled artisans will recognize that the desired shape of the nail may indicate a more preferable production method. In the illustrated embodiment, a fixture 204 may be used to form the stepped nail 206, with a wire 202 or other raw material drawn through the fixture 204, or extruded via pressure on the wire 202. After the fixture 204 has been filled, the excess 208 may be removed to ensure a clean, flat top surface 210 for the stepped interconnect nail 206. Additionally, the stepped interconnect nail 206 may be separated from the wire 202, or source material, to create the bottom surface 212 of the stepped interconnect nail 206.

In particularly useful embodiments, the bottom surface 212 and top surface 210 of the stepped interconnect nail 206 will be the mating surfaces, where the interconnect nail 206 is attached to an upper or lower package. The mating surfaces 210 and 212 will preferably be as flat as possible, so that the interconnect nail 206 makes the most complete surface-to-surface connection possible with the mounting pads on the upper and lower packages. Furthermore, a flat base, or bottom surface 212, permits the interconnect nail 206 to be mounted perpendicularly on a bottom package in preparation for mounting an upper package.

Alternatively, the fixture 204, or die, may be a molding or clamping fixture, where two or more sections of the fixture 204 are compressed over source material 202, forcing the source material 202 to fill the cavity in the fixture 204, and creating a nail 206. In such an embodiment, excess material 208 is squeezed from the fixture 204 and then removed.

Figure 2B:
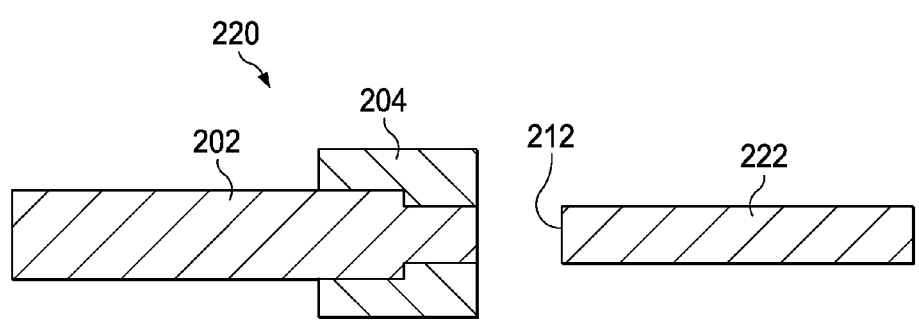

FIG. 2B is a cross-sectional diagram illustrating an alternative embodiment for creation of a cylindrical interconnect nail 222. Here, a wire 202, or other supply material 202 may be extruded through a fixture 204, then the excess cut to form the cylindrical nail 222. Here, a single cut may form the bottom surface 212 of the cylindrical nail, but the same cut may be used for the top surface of the subsequent nail. Alternatively, the extruded cylindrical nail 222 may be cut to length at both ends after extrusion to the desired diameter. Use of a fixture 204, or die, permits a nail of a desired diameter to be created from arbitrarily sized source material 202.

Other alternative embodiments for forming a nail 206 include, but are not limited to casting, drawing, milling, 3D printing or the like. For example, a fixture 204 may hold a wire 202, and the free end may, under a high temperature suitable for increasing the ductility of the metal, be drawn to a desired length. In another exemplary embodiment, a mold 204 having a nail shaped casting orifice may have a molten supply material 202 poured therein, with the nail 206 removed from the mold once the poured nail 206 has solidified and cooled. Alternatively, a nail 206 may, for example, be rectangular, and be cut from sheet material. In yet another embodiment, a CNC or other milling matching may form a nail 206 from raw stock 202 by milling or cutting the raw stock into a desired shape. In another embodiment, one or more nails 206 may be formed by a 3D printing process, where successive layers of material are laid or stacked in a shape that will form the final nail 206. In such an embodiment, nails 206 may be advantageously formed in place on a target package, or may be formed on a storage substrate for later placement onto a package. In yet another embodiment, source material 202, such as an ingot or wire may be heated to a point below the melting point of the source material 202, but enough to suitably soften the material, and then may be drawn to form a cylindrical nail 100 or a conical nail 120.

Skilled artisans will recognize that any combination of methods for creating interconnect nails 202 may also be advantageously employed in the nail creation process. For example, a stepped interconnect nail 140 may be cast, and the ends milled flat to provide suitable mating surfaces.

Additionally, any nail processing may be advantageously performed, including, but not limited to, surface preparation such as milling, polishing, application of anti-oxidation coatings or the like. For example, in one useful embodiment, a copper nail may advantageously have a coating of palladium, gold, nickel, or other suitable material electroplated thereon to aid in preventing oxidation of the copper nail 206 surface.

Figure 3:
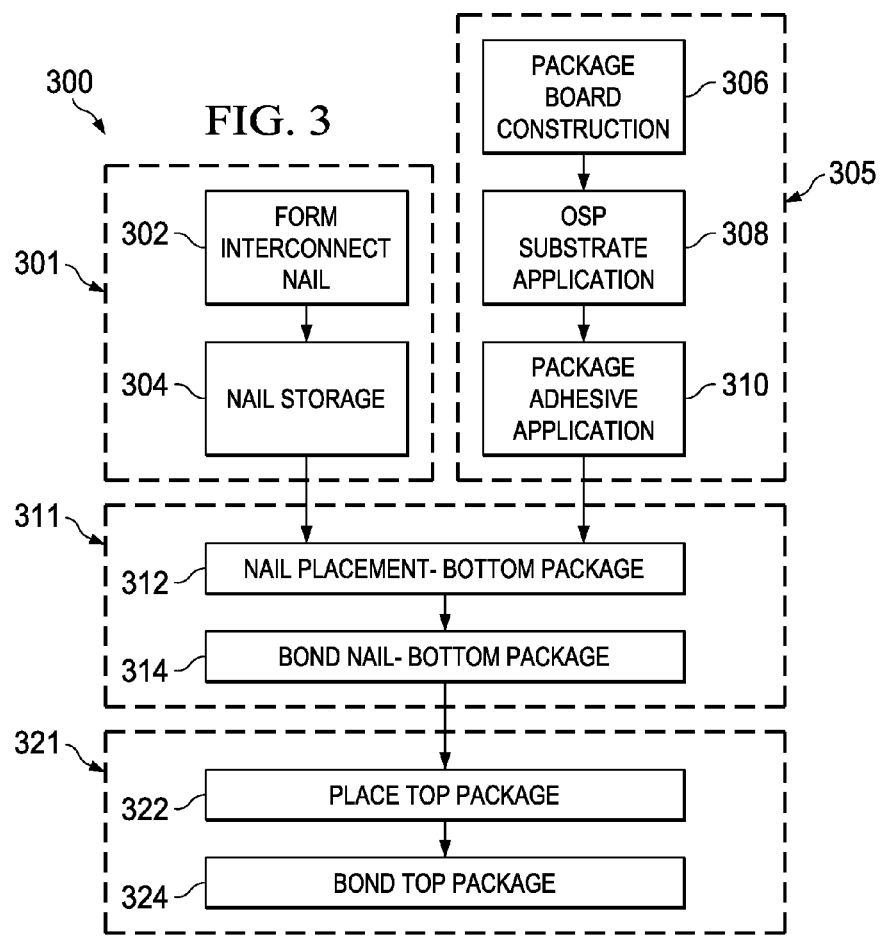
FIG. 3 is a flow diagram illustrating an embodiment of a method for production and application of solid interconnects to form a package-on-package structure.

FIG. 3 is a flow diagram illustrating an embodiment of a method for production and application of solid interconnects to form a package-on-package structure 300. In this embodiment of a package-on-package assembly construction method 300, the method 300 may be comprised of procedure for forming and handling the nails 206, shown in block 301, package preparation, shown in block 305, nail application, shown in block 311, and final package assembly, block 321.

In block 301, nails 206 may be formed using any process described, supra, or via any other suitable process, in block 302. This step may also optionally include any other nail preparation step, including, but not limited to one or more surface preparation procedures, such as anti-corrosion coatings or surface polishing.

In particularly useful embodiments, once prepared for installation in block 302, nails 206 may be optionally stored in block 304 so that the nails may be applied in groups, or prepared in bulk prior to application. For example, nails 206 may be placed in a chip tray, apportioned, counted or moved to various processing devices.

The package preparation procedure in block 305 comprises steps for forming the packages and preparing the packages for nail 206 attachment. In block 306, the packages are constructed. In particularly useful embodiments, the packages will each have one or more mounting pads each configured to accept a nail 206 and disposed on a surface intended to face the opposing package. Particularly useful embodiments will have three or more mounting pads configured for nails 206. For example, the nail compatible mounting pads may be spaced on the bottom pad to support a mounted top pad securely. In such an embodiment, spacing three mounting pads in a generally triangular, or nonlinear, pattern on the bottom mounting pad, and arranged so that the applied nails support the upper package at three nonlinear attachment points may be preferable to arranging three nails in a line, so that a mounted upper package would not twist or tip when pressure is applied to the upper package.

An organic solderability preservative (OSP) may be optionally applied in block 308, with an adhesive applied in block 310. In one useful embodiment, the mounting pads on the upper and lower packages may advantageously be copper. However, as copper oxidizes relatively rapidly when exposed to the temperatures of semiconductor processing, an OSP may be applied to the mounting pads to prevent such oxidation and permit long term storage of packages and maintain the solder adhesion capabilities of the mounting pads. The OSP is preferable when using a solder or solder paste adhesive, as the temperatures required for solder reflow are lower than those required for wire bonding, which tends to oxidize the OSP itself, causing mounting pad oxidation and bond failures. Skilled artisans will recognize that any anti-oxidation coating may be applied to maintain the surface of the mounting pads. Alternatively, the mounting pads may be formed using an electroplated nickel-electroplated palladium-immersion gold technique (EN-EPIG), which has a lower oxidation rate, but is a more expensive and failure prone technique.

An adhesive may be deposited on the mounting pads, directly, or on the OSP, when used. This adhesive may be any conductive material that is configured to affix a nail 206 to a mounting pad. In particularly useful embodiments, an OSP may be deposited on a copper mounting pad, with solder paste or solder be applied to the OSP. Alternatively, a conductive adhesive, comprising electrically conductive particles in an adhesive resin such as a polymer or epoxy may be advantageously employed. Another alternative embodiment may use an electrically conductive adhesive film. While several embodiments for deposition of an adhesive have been described herein, skilled artisans will recognize that any conductive material capable of securing a nail to a bonding pad may be advantageously employed without deviating from the presented principles.

The nail application procedure in block 311 comprises placing the nail 206 on, or mounting the nail to the bottom package in block 312 and bonding or affixing the nail to the bottom package in block 314. The nails 206 may be placed manually, automatically, singly, or as a group. The nails 206 may be advantageously applied, in one embodiment, using a gang bond head apparatus or similar pick-and-place machine. Alternatively, in embodiments where the nail is constructed in place, such as by a 3D printer or the like, the nail construction coincides with the placement.

The procedure for bonding the nail to the bottom package, as in block 314, depends on the type of adhesive used. Where a solvent based, or curing, adhesive is used, the bonding procedure may be comprised of activating the adhesive, or letting the adhesive cure. Alternatively, in embodiments with a solder based adhesive, the bonding method may be comprised of reflowing and cooling the solder material to secure the nail 206 to the mounting pad.

The final package assembly procedure in block 321 comprises mounting and bonding the upper package to the bottom package via the nails attached thereto. The upper package is placed in block 322, such that the top package's target mounting pads are in contact with the nails and adhesive on the mounting pads. The upper package is bonded in block 324 via any suitable procedure, including, but not limited to, those discussed above with respect to bonding the nail to the bottom package in block 314.

Figure 4:
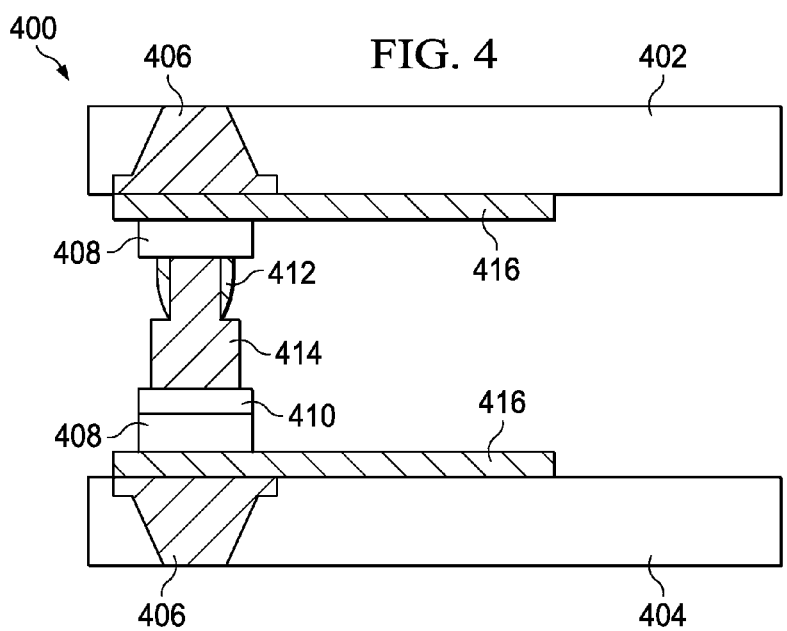
FIG. 4 is a cross-sectional diagram illustrating an embodiment of a bonded single solid interconnect.

FIG. 4 is a cross-sectional diagram illustrating an embodiment of a bonded single solid interconnect nail 400. An upper package 402 comprised of a substrate with a TSV 406 and copper RDL mounting pad 416 is bonded, via a solid copper stepped interconnect nail 414, to a bottom package 404 comprised of a substrate with a TSV 406 and copper RDL mounting pad 416. In this particular embodiment, the RDL mounting pads 416 have an OSP 408 applied to prevent oxidation and promote greater adhesion of the nail 414 to the mounting pad 416. Notably, the procedure for bonding the upper package 402 to the nail 414 may differ from the procedure for bonding the nail 414 to the bottom package 404. In the particularly useful embodiment shown, the bottom package 404 is bonded to the nail 414 via solder paste 410 applied to the OSP 408. It should be noted that, while the OSP 408 is illustrated in this embodiment, the OSP will generally be consumed and disappear during the soldering reflow process.

The upper package 402 is shown in this embodiment as being bonded to the nail 414 with solder 412, the solder 412 having flowed around the narrow body of the nail 414. Thus, the RDL 416 and TSV 406 of the upper package 402, and any upper package component, is electrically connected to the RDL 416 and TSV 406 of the lower package and any lower package component. At the same time, the upper package 402 is rigidly separated from the lower package 404.

Figure 5:
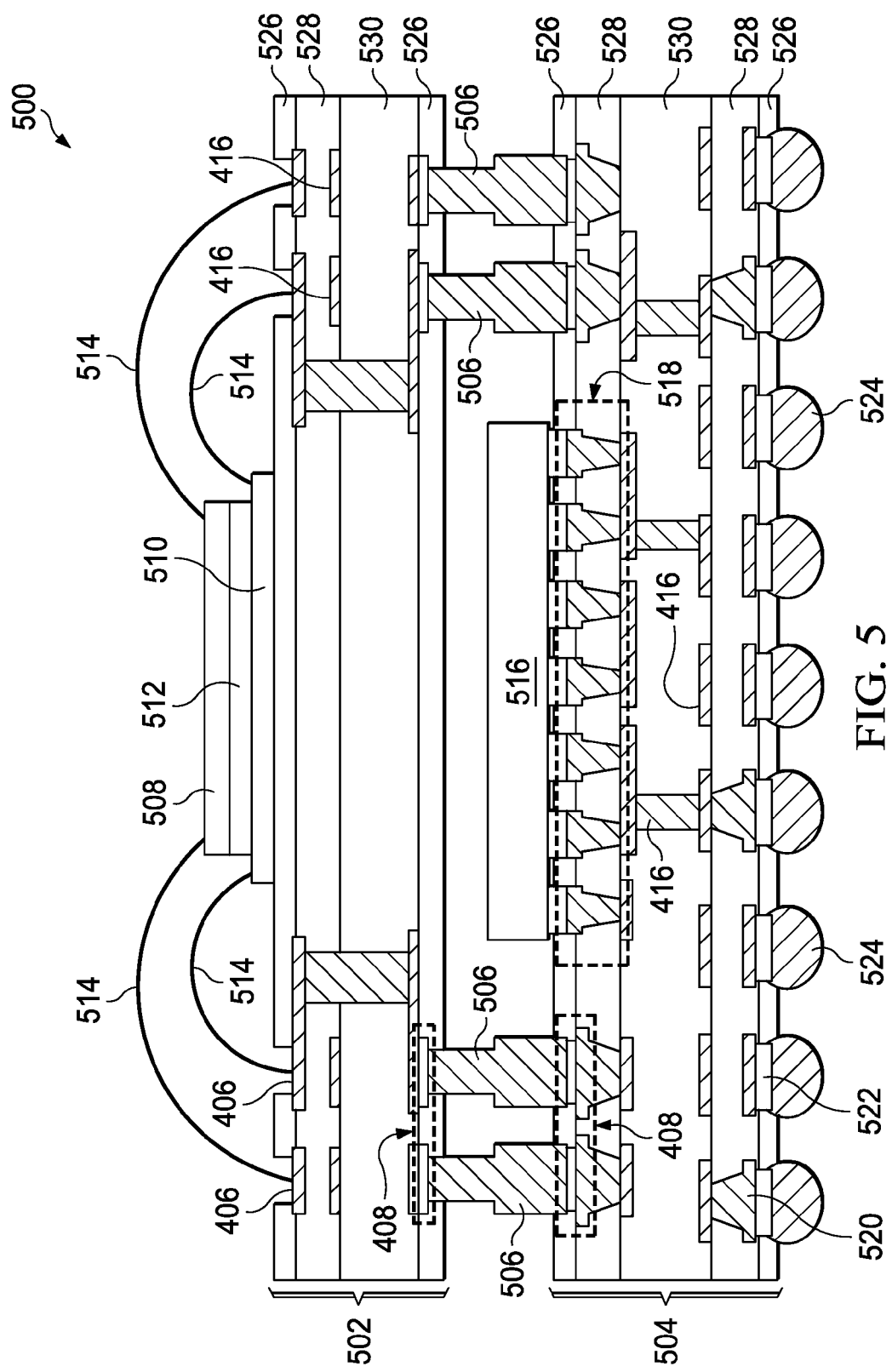
FIG. 5 is cross-sectional diagram illustrating an embodiment of a package-on-package structure employing solid interconnects.

FIG. 5 is cross-sectional diagram illustrating an embodiment of a package-on-package structure employing solid interconnect nails 500. In this exemplary embodiment, an upper package 502 is mounted to a bottom package 504 using a plurality of solid stepped interconnect nails 506. The upper package 502 may have multiple dies mounted on one or both surfaces. For example, a DRAM memory die 508 may be mounted to a display controller die 510 using an adhesive 512, with the memory die 508 and display controller die 510 connected to one or more die mounting pads 406 using wire bonds 514. The upper package 502 may have a multiple layer RDL 416, with integrated TSVs and an insulating barrier layer 528 separating the various RDL levels. Furthermore, the package 502 may be coated with an insulator 526 configured to leave the die mounting pads 406 accessible for wire bonding. The bottom surface of the upper package 502 may also have an insulating layer 532 disposed on the underside of the substrate 530, exposing the RDL layer 416 traces.

Similarly, the bottom package 504 may have a multiple layer RDL structure 416, including TSVs providing electrical connectivity through the substrate 530, and with RDL structure 416 trace layers separated by an insulating barrier layer 528. Mounting pads 520 may extend through the insulating barrier layer 528 to connect subsurface RDL 416 structure layers to exterior features. The bottom package 504 may also have one or more dies 516 disposed on the top and/or bottom surface of the package 504. For example, in the illustrated embodiment, a processor die 516 may be mounted using a technique such as surface mounting, to connect the pins or connects of the die 516 to an array of die mounting pads 518, which in turn are electrically connected to other dies 508 and 510 or output structures 510 via the RDL structure 416.

Solid interconnect nails 506 provide separation, support, and electrical connectivity between the upper package 502 and lower package 504. In particularly useful embodiments, the nail 506 has a length great enough to separate the upper package and lower package 504 far enough to provide adequate space for the processor die 516. In this embodiment, the upper 502 and lower 504 packages may be separated by about 150 micrometers, corresponding to a nail 506 height of about 150 micrometers. Skilled artisans will recognize that a greater separation can be achieved using longer nails, which may be useful in embodiments calling, for example, for thicker dies, or where dies are mounted on both the bottom surface of the top package 502 and on the top surface of the bottom package 504. Thus, a predetermined spacing can be achieved using a corresponding nail height. In particularly useful embodiments, the nail 506 may have a length between about 50 and 500 micrometers. Additionally, the spacing between the top package 502 and bottom package 504 may dictate that a variation in the length or height of the nail be made to account for OSP, adhesive or other materials in the nail 506 assembly stack. The nails 506 are mounted via an adhesive 408 such as solder paste to the RDL structure 416 and the solid structure of the nails gives the overall package 500 rigidity of the physical connection between the upper package 502 and lower package 504.

The package-on-package structure 500 may also have a structure for mounting and electrically connecting the overall structure 500 to a carrier board or the like. In particularly useful embodiments, the package-on-package structure may have a ball grid array comprised of solder balls 524 disposed on the bottom surface of the lower package 506, providing electrical connectivity to the devices and structures in the package structure 500 and any carrier board.

Although the present embodiments and their advantages have been described in detail, it should be understood that various changes, substitutions and alterations can be made herein without departing from the spirit and scope of the disclosure as defined by the appended claims. It will be readily understood by those skilled in the art that many of the features and functions discussed above can be implemented using a variety of materials and orders to the processing steps. For example, nails may be solid or hollow, as long as they are rigid or otherwise capable of securely separating opposing packages. Nails may also be any conductive material, or even a semiconductor material where such material is called for. As another example, it will be readily understood by those skilled in the art that many of the steps for creating a package-on-package structure may be performed in any advantageous order while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, apparatuses, manufacture, compositions of matter, means, methods, or steps.

What is claimed is:

1. A method for forming a package-on-package assembly comprising:
    providing a first package comprising:
        a first substrate;
        a first redistribution layer (RDL) on a first side of the first substrate:
        a first mounting pad on and electrically coupled to the first RDL, the first mounting pad having a first part with a uniform width, and a second part with a width that decreases continuously along a direction from the first side of the first substrate to a second side of the first substrate opposing the first side of the first substrate, the second part being physically connected to the first RDL;
    providing a second package comprising:
        a second mounting pad on a first side of the second package;
        a plurality of third mounting pads on a second side of the second package opposing the first side of the second package;
        a first through silicon via (TSV) electrically coupling the second mounting pad and at least one of the plurality of third mounting pads;
        a first semiconductor die attached to the second side of the second package;
        a second semiconductor die attached to the first semiconductor die, the first semiconductor die and the second semiconductor die being wire bonded to the plurality of third mounting pad;
    applying a first organic solderability preservative (OSP) on the first mounting pad of the first package and applying a first solder on the first OSP;
    mounting an interconnect nail on the first mounting pad of the first package, wherein the interconnect nail has a height-to-diameter aspect ratio of larger than 1, and is formed before the mounting the interconnect nail, wherein the interconnect nail has a first cylindrical portion with a first diameter and a second cylindrical portion with a second diameter smaller than the first diameter, wherein there is a step change in a diameter of the interconnect nail at an interface between the first cylindrical portion and the second cylindrical portion, and wherein the first cylindrical portion is attached to and physically contacts the first mounting pad;
    applying a second OSP on the second mounting pad of the second package and applying a second solder on the second OSP; and
    mounting the second package on the interconnect nail such that the second cylindrical portion of the interconnect nail is coupled to and physically contacts the second mounting pad of the second package, wherein after the mounting, the second solder covers sidewalls of the second cylindrical portion of the interconnect nail and stops at the interface between the first cylindrical portion and the second cylindrical portion of the interconnect nail, wherein the interconnect nail prevents the second package from contacting a third semiconductor die attached to a center region of a first side of the first package facing the second package, wherein the first RDL, the first mounting pad, the interconnect nail, the second mounting pad, the first TSV, and the plurality of third mounting pads provide an electrical connection between the first semiconductor die and at least one of the second semiconductor die and the third semiconductor die, and wherein a length of the interconnect nail remains the same after the mounting the second package.

2. The method of claim 1, wherein the mounting the interconnect nail comprises soldering the interconnect nail to the first mounting pad of the first package.

3. The method of claim 2, wherein the interconnect nail is copper, and the first mounting pad and the second mounting pad are copper.

4. The method of claim 1, wherein the interconnect nail is formed from a material selected from the group consisting of copper, gold, aluminum, palladium, nickel, silver and a gold-nickel alloy.

5. A method for constructing a solid interconnect for a package-on-package assembly comprising:
    forming a nail having a length providing a predetermined package separation, wherein the nail has flat end surfaces and comprises a bottom cylindrical body having a first radius and a top cylindrical body having a second radius smaller than the first radius, wherein there is a step change in a diameter of the nail from the top cylindrical body to the bottom cylindrical body at an interface between the top and the bottom cylindrical bodies of the nail;
    after the forming the nail, placing the nail on a first mounting pad on a first package, wherein the first mounting pad has a first organic solderability preservative (OSP) disposed thereon and a first electrically conductive adhesive disposed on the first OSP, wherein the first package comprises a first substrate and a first redistribution layer (RDL) over a first side of the first substrate, wherein the first mounting pad has a first part and a second part, wherein the first part has a uniform width, and the second part has a width that tapers off along a direction from the first side of the first substrate to a second side of the first substrate opposing the first side of the first substrate, wherein the second part of the first mounting pad is physically connected to the first RDL;
    after the placing, bonding the nail to the first mounting pad of the first package such that the nail physically contacts the first mounting pad of the first package;
    mounting a second package on the nail, wherein the second package has a first side facing the first package and a second side facing away from the first package, wherein the second package has a second mounting pad proximate the first side of the second package, a plurality of third mounting pads proximate the second side of the second package, and a second through silicon via (TSV) electrically coupling the second mounting pad with at least one of the plurality of third mounting pads, wherein the second package has a first semiconductor die attached to the second side of the second package, and a second semiconductor die attached to the first semiconductor die, wherein the first semiconductor die and the second semiconductor die are wire bonded to the plurality of third mounting pads, wherein a third semiconductor die is located between the first package and the second package and the nail physically keeps the second package from being in contact with the third semiconductor die, wherein the second mounting pad of the second package has a second OSP disposed thereon and a second electrically conductive adhesive disposed on the second OSP, wherein the second package is mounted such that the nail contacts the second electrically conductive adhesive; and bonding the nail to the second mounting pad of the second package such that the top cylindrical body of the nail physically contacts the second mounting pad of the second package and provides an electrical connection between the first mounting pad of the first package and the second mounting pad of the second package, wherein after the bonding the nail to the second mounting pad, a bonding material extends continuously along sidewalls of the top cylindrical body of the nail and stops at the interface between the top and the bottom cylindrical bodies of the nail.

6. The method of claim 5, wherein the forming the nail comprises:
forcing a source material through a fixture, the fixture having a cavity with a stepped shape, the source material inside the cavity filling the cavity and acquiring the stepped shape of the cavity; and
separating the source material inside the cavity from the source material outside the cavity.

7. The method of claim 5, wherein the forming the nail comprises:
drawing a source material such that a portion of the source material has a predetermined diameter, wherein the source material is drawn at an elevated temperature below a melting point of the source material; and
separating at least a portion of the drawn source material having the predetermined diameter from the remainder of the source material.

8. The method of claim 5, wherein the forming the nail comprises casting the nail from a liquefied metal in a mold.

9. The method of claim 5, wherein the forming the nail comprises coating the nail with an anti-oxidation coating comprising palladium or gold.

10. The method of claim 5, further comprising placing another nail on the first package so that the nails have a bond pitch between about 50 and 350 micrometers.

11. The method of claim 5, wherein the first electrically conductive adhesive and the second electrically conductive adhesive are each selected from a group comprising solder and solder paste;
wherein the bonding the nail to the first mounting pad comprises soldering the nail to the first mounting pad of the first package; and
wherein the bonding the nail to the second mounting pad comprises soldering the nail to the second mounting pad of the second package.

12. A method for forming a package-on-package assembly comprising:
providing an interconnect nail having flat end surfaces, the interconnect nail comprising a conductive material, the interconnect nail having a rigid structure and a height-to-diameter ratio of larger than 1, the interconnect nail having a stepped shape with a first cylindrical portion and a second cylindrical portion, the first cylindrical portion having a first diameter larger than a second diameter of the second cylindrical portion;
applying a first conductive adhesive to a first mounting pad on a first side of a first package, wherein the first mounting pad is physically connected to a first redistribution layer (RDL) on a first side of a first substrate of the first package, the first RDL being electrically connected to a second RDL on a second side of the first substrate opposing the first side of the first substrate via a first through silicon via (TSV), wherein the first mounting pad comprises a first part with a uniform first width, and a second part with a second width physically connected to the first RDL, wherein the second width decreases continuously along a direction from the first side of the first substrate to the second side of the first substrate, wherein the first package comprises a plurality of external connectors on a second side of the first package opposing the first side of the first package, wherein the applying comprises:
applying a first organic solderability preservative (OSP) on the first mounting pad; and
applying a first solder paste on the first OSP;
bonding a first end surface of the first cylindrical portion of the interconnect nail to the first mounting pad of the first package by the first conductive adhesive such that the interconnect nail is attached to and physically contacts the first mounting pad of the first package, wherein the interconnect nail is premade prior to the bonding, wherein the interconnect nail has a first length before and after the bonding the interconnect nail;
applying a second OSP to a second mounting pad on a first side of a second package, wherein the second mounting pad is electrically connected to at least one of a plurality of third mounting pads on a second side of the second package opposing the first side of the second package via a second TSV, wherein the second package comprises a first semiconductor die attached to the second side of the second package, and a second semiconductor die smaller than the first semiconductor die attached to the first semiconductor die, wherein the first semiconductor die and the second semiconductor die are wire bonded to the plurality of third mounting pads via wire bonds; and
mounting the second package on the interconnect nail by way of a second conductive adhesive such that the second cylindrical portion of the interconnect nail is attached to and physically contacts the second mounting pad of the second package, wherein a third semiconductor die is located between the first package and the second package, the third semiconductor die being bonded to the first package via a plurality of die mounting pads disposed in a center region of the first side of the first package, wherein the third semiconductor die is electrically coupled to the first semiconductor die and the second semiconductor die via at least the first RDL, the first mounting pad, the interconnect nail, the second mounting pad, the second TSV, the plurality of third mounting pads and the wire bonds, wherein the interconnect nail prevents the second package from contacting the third semiconductor die,
wherein, after the mounting the second package, the interconnect nail has about the first length, the second conductive adhesive extends continuously on the interconnect nail along a direction from the second package to the first package, wherein the second conductive adhesive covers sidewalls of the second cylindrical portion of the interconnect nail and stops at an interface between the first cylindrical portion and the second cylindrical portion, wherein there is a step change in the diameter of the interconnect nail from a first side of the interface to a second side of the interface.

13. The method of claim 12, wherein, after mounting the second package, the first conductive adhesive is spaced apart from the second conductive adhesive.

14. The method of claim 12, wherein the first conductive adhesive and the second conductive adhesive each comprises solder or solder paste;
wherein the bonding the interconnect nail comprises reflowing the first conductive adhesive to bond the interconnect nail to the first mounting pad; and wherein the mounting the second package comprises reflowing the second conductive adhesive to bond the interconnect nail to the second mounting pad.

15. The method of claim 12, wherein the providing the interconnect nail comprises forming the interconnect nail from one of copper, gold, aluminum, palladium, nickel, silver or gold-nickel alloy.

16. The method of claim 5, wherein the first package further comprises a first TSV connected to the first mounting pad, wherein center axes of the first TSV, the nail and the second TSV are aligned.

17. The method of claim 12, wherein the first part of the first mounting pad has a substantially rectangular cross section, the second part of the first mounting pad has a substantially trapezoidal cross section.

18. The method of claim 1, wherein the first package further comprises:
 a second RDL on the second side of the first substrate; and
 a second TSV in the first substrate, the second TSV electrically coupling the first RDL with the second RDL.

19. The method of claim 18, wherein the first package further comprises a plurality of external connectors on a second side of the first package opposing the first side of the first package, the plurality of external connectors electrically coupled to the second RDL.

20. The method of claim 1, wherein the second semiconductor die has a surface area that is smaller than a surface area of the first semiconductor die.

\* \* \* \* \*